United States Patent [19]
Ishibashi

[11] Patent Number: 5,426,607
[45] Date of Patent: Jun. 20, 1995

[54] REDUNDANT CIRCUIT FOR MEMORY HAVING REDUNDANT BLOCK OPERATIVELY CONNECTED TO SPECIAL ONE OF NORMAL BLOCKS

[75] Inventor: Kenji Ishibashi, Osaka, Japan

[73] Assignee: Sharp Kabushiki Kaisha, Osaka, Japan

[21] Appl. No.: 91,732

[22] Filed: Jul. 14, 1993

Related U.S. Application Data

[63] Continuation of Ser. No. 708,716, May 31, 1991, abandoned, which is a continuation-in-part of Ser. No. 580,352, Sep. 7, 1990, abandoned, which is a continuation of Ser. No. 335,375, Apr. 10, 1989, abandoned.

[30] Foreign Application Priority Data

Apr. 27, 1988 [JP] Japan .................... 63-105744

[51] Int. Cl.$^6$ .................... G11C 7/00; G11C 29/00
[52] U.S. Cl. .................... 365/200; 365/230.03
[58] Field of Search ............ 365/200, 230.03, 230.04

[56] References Cited

U.S. PATENT DOCUMENTS

| | | | |
|---|---|---|---|
| 4,281,398 | 7/1981 | McKenny et al. | 365/200 |
| 4,376,300 | 3/1983 | Tsang | 365/200 |
| 4,392,211 | 7/1983 | Nakano et al. | 365/200 |
| 4,601,019 | 7/1986 | Shah et al. | 365/200 |
| 4,648,075 | 3/1987 | Segawa et al. | 365/200 |
| 4,656,610 | 4/1987 | Yoshida et al. | 365/200 |
| 4,754,434 | 6/1988 | Wang et al. | 365/200 |
| 4,796,234 | 1/1989 | Itoh et al. | 365/200 |
| 4,829,480 | 5/1989 | Seo | 365/200 |
| 4,866,676 | 9/1989 | Crisp et al. | 365/200 |
| 4,918,662 | 4/1990 | Kondo | 365/200 |
| 5,021,944 | 6/1991 | Sasaki et al. | 365/200 |
| 5,124,948 | 6/1992 | Takizawa et al. | 365/200 |

*Primary Examiner*—Jack B. Harvey
*Assistant Examiner*—Michael A. Whitfield

[57] ABSTRACT

A redundant circuit for a memory circuit having a plurality of memory cell blocks, which includes a redundant memory cell block for a predetermined one of the memory cell blocks. There is a redundancy decoder for producing a redundant memory cell selecting signal, and a block selecting signal generating circuit. The output of the block selecting signal generating circuit is arranged to be controlled by the redundant memory cell selecting signal for the predetermined memory cell block so as to relieve a faulty memory cell block by the redundant memory cell block of the predetermined memory cell block.

4 Claims, 3 Drawing Sheets

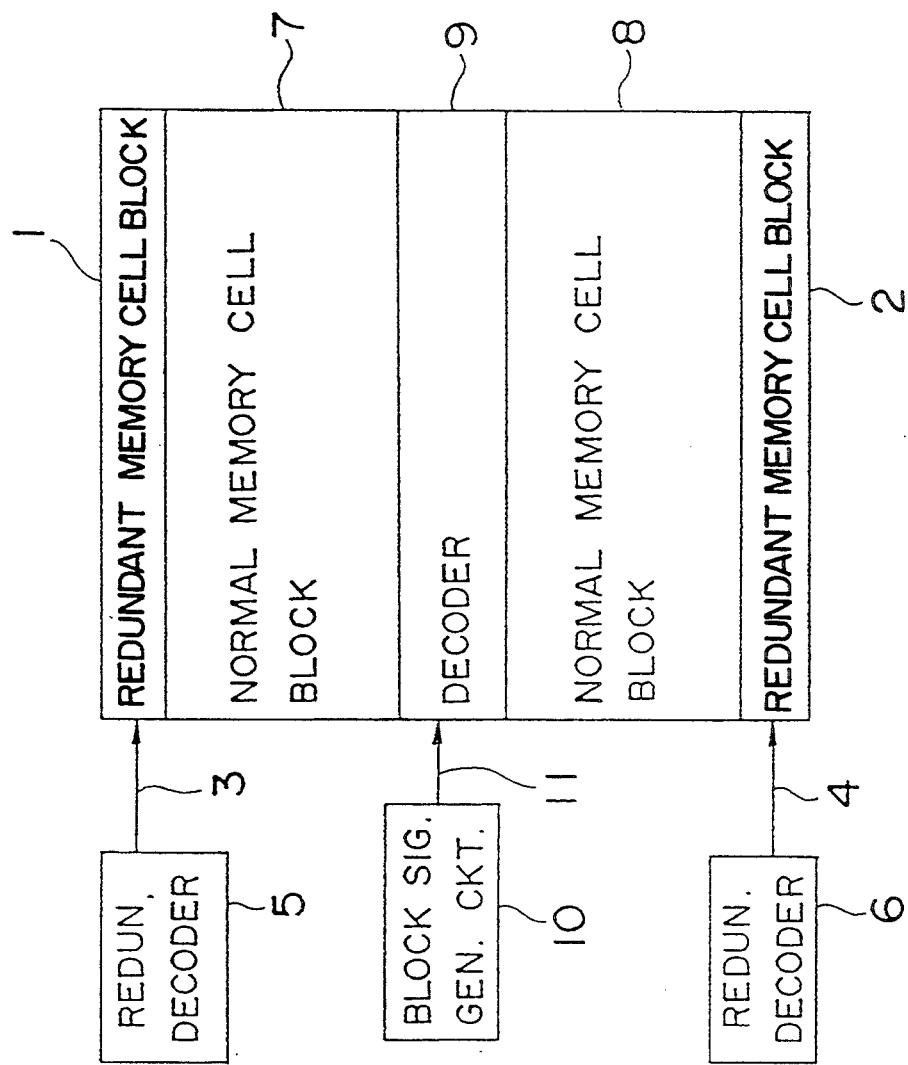

REDUNDANT CIRCUIT FOR MEMORY HAVING REDUNDANT BLOCK OPERATIVELY CONNECTED TO SPECIAL ONE OF NORMAL BLOCKS

This application is a continuation of application Ser. No. 07/708,716, filed on May 31, 1991, which is a continuation-in-part of Ser. No. 07/580,352, filed Sep. 7, 1990, which was a continuation of Ser. No. 07/335,375, filed Apr. 10, 1989 now all abandoned.

BACKGROUND OF THE INVENTION

The present invention generally relates to an electrical arrangement, and more particularly, to a redundant circuit for a memory circuit having a plurality of memory cell blocks. A redundant memory cell of one block is arranged to be capable of commonly serving as a redundant memory cell of another block.

In memory circuits, it is conventional to divide a memory cell into a plurality of blocks for various reasons. An example is shown in FIG. 3, where a conventional circuit arrangement includes a memory circuit having normal memory cell blocks 7 and 8, redundant memory cells blocks 1 and 2 for the memory cell blocks 7 and 8, decoder 9, redundancy decoders 5 and 6 coupled with the redundant memory cell blocks 1 and 2, and a block signal generating circuit 10 coupled with the decoder 9. Thus, it is necessary to provide the redundant memory cell blocks 1 and 2 and the redundancy decoders 5 and 6 for generating selecting signals on lines 3 and 4 for the redundant memory cell blocks 1 and 2 for relieving a faulty memory cell.

In the conventional circuit arrangement as described above, however, since a block selecting signal on line 11 of the block signal generating circuit 10 for the decoder 9 which produces the selecting signal with respect to the memory cell blocks 7 and 8 is not controlled by the redundant memory cell selecting signals on lines 3 and 4, the respective blocks 7 and 8 are required to have the redundant memory cell blocks 1 and 2. This structure requires the corresponding redundancy decoders 5 and 6, thus complicating the circuit construction, which is not a desirable feature.

SUMMARY OF THE INVENTION

Accordingly, an essential object of the present invention is to provide a redundant circuit for a memory circuit, which is extremely simple in construction, and readily manufactured at low cost.

Another object of the present invention is to provide a redundant circuit of the above described type which is stable in functioning and is of high reliability.

In accomplishing these and other objects, according to one preferred embodiment of the present invention, there is provided a redundant circuit for a memory circuit having a plurality of memory cell blocks, which includes a redundant memory cell block for a predetermined one of said memory cell blocks, a redundancy decoder for producing a redundant memory cell selecting signal, and a block selecting signal generating circuit. The output of said block selecting signal generating circuit is arranged to be controlled by said redundant memory cell selecting signal for the predetermined memory cell block. Thereby, a faulty memory cell of the other memory cell block is relieves by the redundant memory cell block of said predetermined memory cell block.

More specifically, in FIG. 1 showing the circuit arrangement in the case where the redundant circuit according to an embodiment of the present invention is employed, the memory circuit includes the normal memory cell blocks 15 and 16 and the redundant memory cell block 17, which is coupled in this case, with the memory cell block 15. The decoder 12, which produces the selecting signal of the memory cells for the respective blocks, obtains the selecting signal for the respective blocks from the block selecting signal generating circuit 14. The redundant memory cell block 17 obtains the selecting signal on line 18 therefor from the redundant decoder 19. The redundant memory cell selecting signal on line 18 is also applied to the block selecting signal generating circuit 14 so as to control said block selecting signal generating circuit 14, so that during generation of the redundant memory cell selecting signal on line 18, the right side memory cell block (i.e., memory cell block 15) selecting signal on line 36 is to be outputted at all times.

In the case where the redundant circuit is not selected either of the memory cell blocks 16 (the left memory cell block) or 15 (the right memory cell block) are in the selected state. Then, either output enable signal on line 30 and selection signal on line 32 (output enable signal on line 36) and selective signal on line 34 are active. Also, the memory cell block 16 (the left memory block) or the memory cell block 15 (the right memory block) are outputted to a common data bus.

In the case where the redundant circuit is selected, as an example in FIG. 1, redundant memory cell block 17 becomes active as a selection for a faulty memory cell. A redundant selection signal on line 18 is activated by the redundant decoder 19. Simultaneously line 30 and 36 are forcibly made non-active to stop the output from the normal memory cell blocks 16 or 15. This prevents collision with the output from the redundant memory cell block 17 on the common data lines 27. As the example shown in FIG. 1, the redundant memory cell which is coupled with the right side block, the selection signal on line 34, is made active, the selection signal on line 32 is made inactive.

By the arrangement of the present invention as described above, an improved redundant circuit may be provided through an extremely simple circuit construction as compared with conventional arrangements of this kind.

BRIEF DESCRIPTION OF THE DRAWINGS

The objects and features of the present invention will become clearer from the following description taken in conjunction with the preferred embodiments thereof with reference to the accompanying drawings, in which:

FIG. 3 is a block diagram similar to FIG. 1, which particularly relates to a conventional arrangement for a redundant circuit.

DETAILED DESCRIPTION OF THE PREFERRED EMBODIMENTS OF THE PRESENT INVENTION

Figure 1:
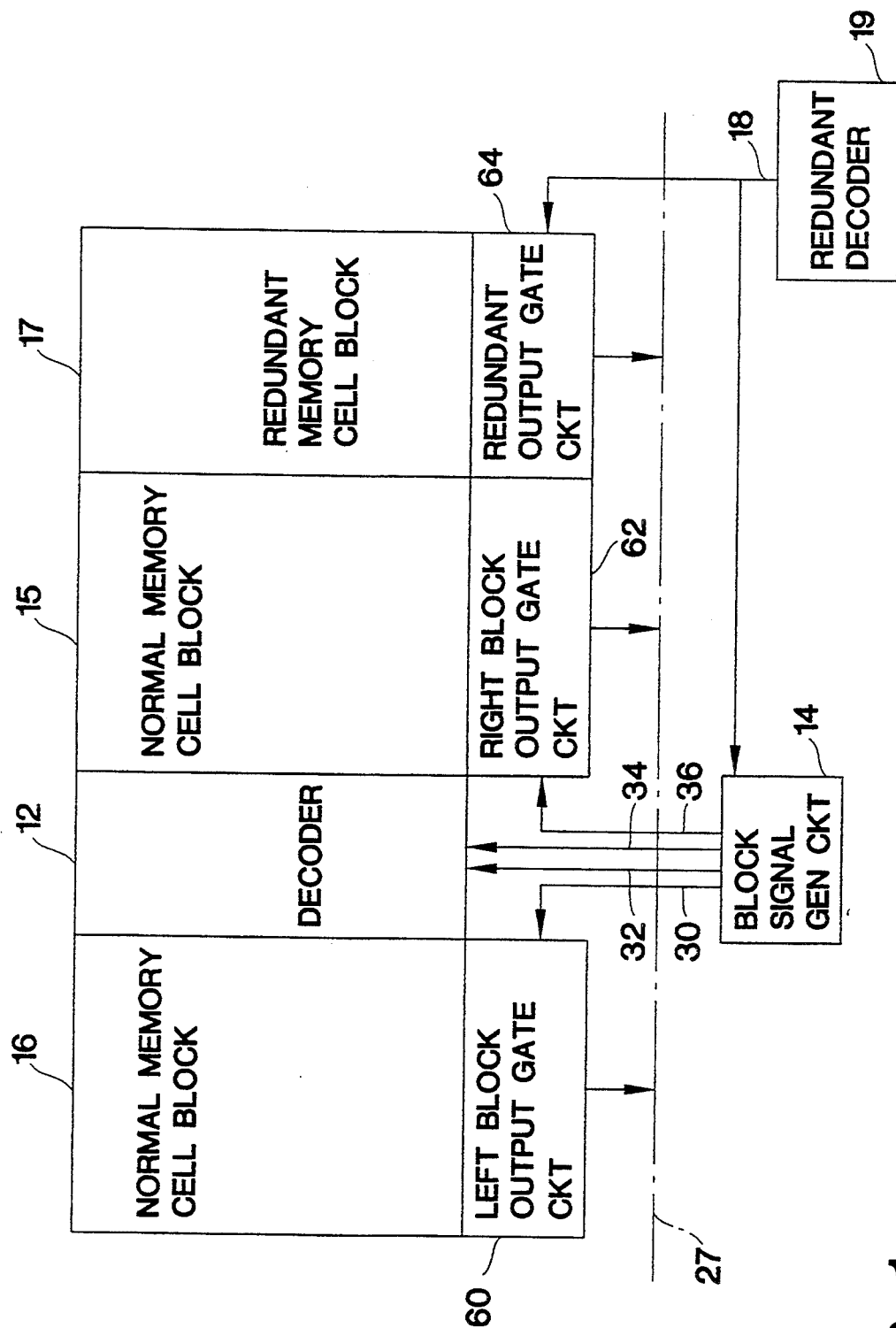
FIG. 1 is a block diagram of a memory circuit to which a redundant circuit according to the present invention is applied.

Before the description of the present invention proceeds, it is to be noted that like parts are designated by like reference numerals throughout the accompanying drawings.

Figure 2:
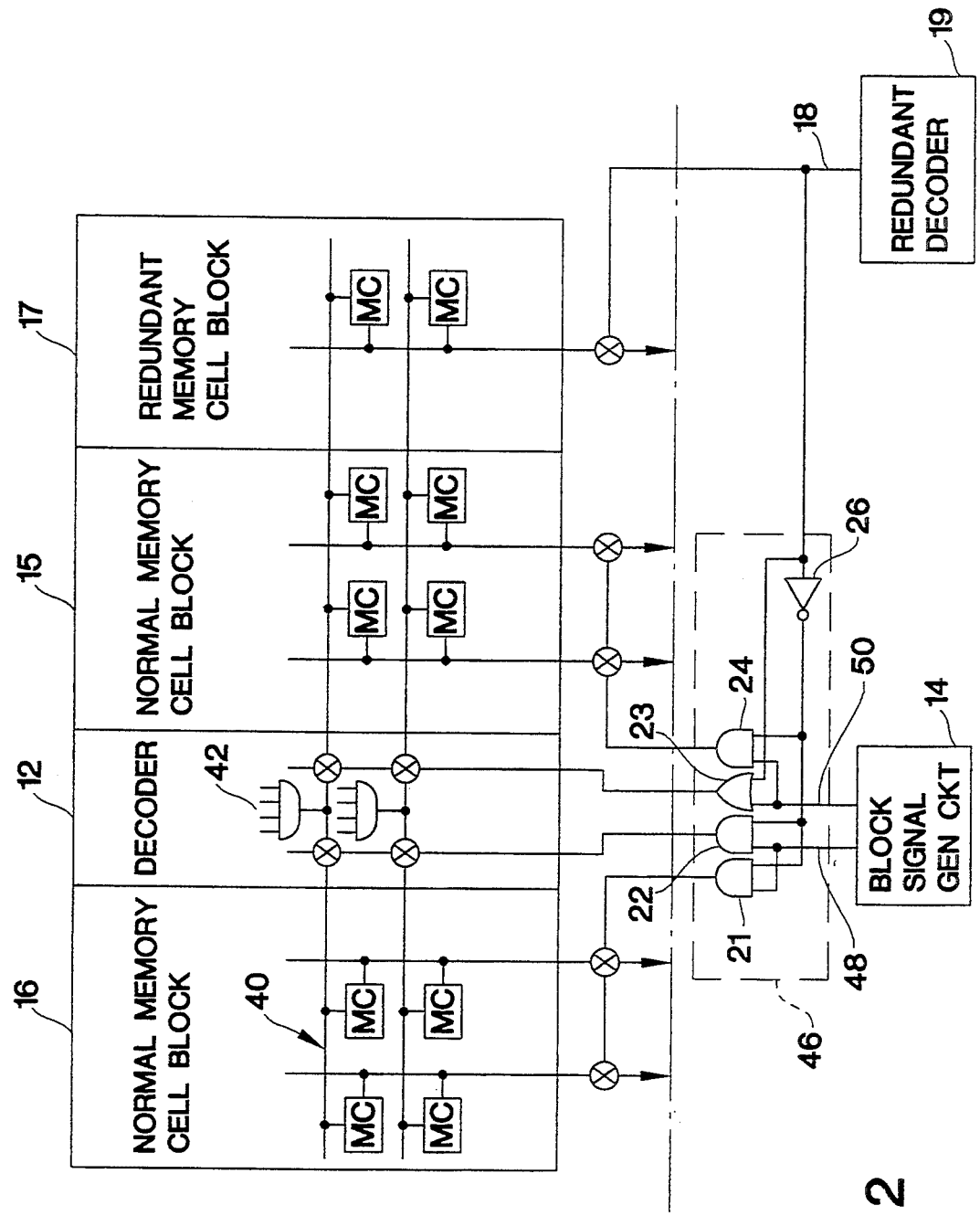
FIG. 2 is a circuit diagram showing one preferred embodiment of the redundant circuit according to the present invention.

Referring now to the drawings, there is shown in FIG. 2 a redundant circuit according to one preferred embodiment of the present invention incorporated in a memory circuit, which generally includes normal memory cell blocks 15 and 16 shown in the drawing at the right and left sides of a decoder 12, a redundant memory cell block 17 to be commonly used for the memory cell blocks 15 and 16, a redundancy decoder 19 coupled with the redundant memory cell block 17, and a block signal generating circuit 14a coupled with the decoder 12 through a control logic circuit 46 which includes gates 21, 22, 23 and 24 which are also coupled with the redundancy decoder 19 via an inverter 26.

The gates 21–24 and the inverter 26 are employed for controlling block selecting signals on line 48 and 50 by the redundant memory cell selecting signal 18 from the redundancy decoder 19. When the redundant memory cell selecting signal on line 18 reaches a "high" level in the selected state, the left side block selecting signal on line 50 is forcibly "unselected", with the right side block selecting signal on line 50 being selected by the gates 21–24 as referred to above, whereby the redundant memory cell block 17 is selected. Meanwhile, when the redundant memory cell selecting signal on line 18 from the redundant decoder 19 is of an unselected state (low level), the output of the block selecting signal generating circuit 14a is applied to the decoder 12 as it is, and thus, the right side memory cell block 15 or left side memory cell block 16 is selected.

In FIG. 2 there is illustrated a gate circuit. Element 42 is one example of an internal circuit for decoder 12. The blocks MC represent memory cells, while 40 is a word selecting line.

As is clear from the foregoing description, according to the arrangement of the present invention, the redundant circuit may be constructed through extremely simple construction as compared with the conventional arrangements for a wide application in the actual use.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A redundant circuit for a memory circuit including a plurality of memory cell blocks, comprising:
   a redundant cell block which is operatively connectable with only a specific one of the plurality of memory cell blocks, and activated by a first redundant cell block selecting signal emitted from said specific one cell block,
   a block decoder which is responsive to a redundant memory selecting signal developed by a redundant decoder and includes means for generating a second redundant cell block selecting signal, and
   inhibiting means for selecting only input/output from the redundant cell block in response to said redundant memory selecting signal, and inhibiting input/output from other cell blocks in response to said second redundant cell block selecting signal.

2. A redundant circuit as claimed in claim 1, further including a redundant decoder for generating said redundant memory selecting signal.

3. A redundant circuit as claimed in claim 1, wherein the first redundant cell block selecting signal is generated by a selecting decoder, which is responsive to said second redundant cell block selecting signal.

4. A redundant circuit as claimed in claim 1, wherein a redundant cell in the redundant cell block corresponds to a specific defective cell in said specific one of said plurality of memory cell blocks, present in the direction of the word line thereof.

* * * * *